United States Patent [19]
Watanabe et al.

[11] 3,936,575
[45] Feb. 3, 1976

[54] FLEXIBLE METAL-CLAD LAMINATES AND METHOD FOR MANUFACTURING THE SAME

[75] Inventors: Tsutomu Watanabe; Takahiro Nakayama; Sigenori Yamaoka, all of Yokohama, Japan

[73] Assignee: Sumitomo Bakelite Company, Limited, Tokyo, Japan

[22] Filed: Feb. 19, 1974

[21] Appl. No.: 443,621

[30] Foreign Application Priority Data
Feb. 21, 1973 Japan................................. 48-20246
June 20, 1973 Japan................................. 48-68800

[52] U.S. Cl. ................. 428/417; 156/330; 428/418
[51] Int. Cl.².. E05D 3/48; E05D 3/96; E05D 15/00
[58] Field of Search ....... 156/330; 161/184, DIG. 7; 174/68.5; 260/2 EA, 2 EC, 47 EA, 831, 837 R; 428/901, 417, 418

[56] References Cited
UNITED STATES PATENTS

| | | | |
|---|---|---|---|
| 2,920,990 | 1/1960 | Been et al. | 161/184 |
| 3,639,500 | 2/1972 | Muny et al. | 260/837 R |
| 3,686,045 | 8/1972 | Foster | 156/53 |
| 3,709,840 | 1/1973 | Dehoff | 260/2 EC |
| 3,717,543 | 2/1973 | Sinclair et al. | 161/186 |
| 3,723,223 | 3/1973 | LeCompte | 156/313 |
| 3,732,332 | 5/1973 | Curtis et al. | 260/837 R |
| 3,759,777 | 9/1973 | Lubowitz et al. | 156/330 |
| 3,841,959 | 10/1974 | Mertens | 161/163 |

*Primary Examiner*—William A. Powell
*Assistant Examiner*—Brian J. Leitten
*Attorney, Agent, or Firm*—Karl W. Flocks

[57] ABSTRACT

A metal-clad laminate as a base board for a flexible printed circuit, consisting of a metal foil and a base sheet composed of a fibrous base material impregnated with a resin composition comprising a polyepoxy compound and a styrene copolymer containing structural units of maleic anhydride and/or a monoalkyl maleate. The said resin composition cures rapidly, so that the fibrous base material impregnated with said composition can be laminated in a continuous way with a metal foil and, moreover, the composition imparts to the resulting laminate flexibility and heat resistance suitable for flexible printed circuits. Said resin composition may comprise, in addition to the above-said components, a reactive epoxy diluent, an acrylonitrile-butadiene copolymer, and/or a mixture of a saturated polyester resin and a polyisocyanate compound, in order to improve the flexiblity and adhesion of the base sheet to metal foil. A prepreg obtained by impregnating the fibrous base material with the above-resin composition is not only suitable for manufacturing a flexible printed circuit base board excellent in soldering heat-resistance, bending resistance, and parts-loadability, but also usable as a heat-resistant cover-lay for flexible printed circuits or as an interlayer adhesive sheet.

28 Claims, No Drawings

FLEXIBLE METAL-CLAD LAMINATES AND METHOD FOR MANUFACTURING THE SAME

This invention relates to a base board for flexible printed circuits which is suitable for a highly compacted three-dimensional wiring in electronic instruments, and to a method for manufacturing the same.

An object of this invention is to provide a metal-clad laminate for printed circuits, which has a high bond strength along with excellent flexibility, heat resistance, and chemical resistance and is extremely useful in actual service, obtained by impregnating an electrically insulating fibrous base material with a resin composition and bonding the resulting base sheet to a metal foil.

Another object of this invention is to provide a resin composition suitable for obtaining a metal-clad laminate for flexible printed circuits having the above-noted excellent qualities by impregnating an electrically insulating fibrous base material with said resin composition and bonding the resulting base sheet to a metal foil in a continuous way by means of a roll-laminator.

A further object of this invention is to provide an electrically insulating fibrous base material impregnated with a resin composition, which is highly heat-resistant and suitable as an insulating cover-lay of the flexible printed circuits, for the multi-lamination of flexible printed circuits to one another and for bonding of a flexible printed circuit to a rigid printed circuit.

In recent years, with the progress of electronic and electric instrument industries, reduction in size and weight and high reliance of instruments for communications industry, home applicances and the like, and simplification of assembling system have been required, and the use of highly compacted and high-performance printed circuit boards has been desired. Particularly, a flexible printed circuit board having a thin and light base sheet and foldable enough to be three-dimensionally assembled can meet the above requirements and has an advantage in achieving the rationalization of wiring by permitting three-dimensional wiring which has been impossible with conventional rigid printed circuit boards, whereby its application field is being further expanded.

The insulating base materials used for the flexible printed circuit boards have generally been such highly flexible plastic films as polyester film, polyethylene film, polyvinyl chloride film, polyamide-imide film, and polyimide film. However, polyester film, polyethylene film, and polyvinyl chloride film are poor in soldering heat-resistance required in assembling the printed circuit board in instruments, while polyamide-imide film and polyimide film, though excellent in heat resistance, have a disadvantage of an extremely high price which renders economically difficult their use in common devices. Although excellent in flexibility, the printed circuit boards having these films as the base material are, on the other hand, too soft to be loaded with small parts such as IC and capacitors, so that in some cases it becomes necessary to back the circuit portion with a rigid insulating sheet in contradiction to the originally intended use of said board in highly compacted mounting.

Under the above circumstances, it would be extremely advantageous if a flexible base board should be available which is comparable in price with a generally used polyester film, yet superior in soldering heat-resistance at a temperature (260°C. or higher) at which an eutectic tin-lead solder can be used in assempling the printed circuit board, and which is flexible, yet capable of being loaded with parts.

An electrically insulating fibrous base material such as, for example, glass fabric, is preferable as the base material for obtaining such flexible printed circuits as mentioned above, because said base material has an adequate stiffuess, is also excellent in chemical characteristics, heat resistance, and dimensional stability, and is less expensive than the heat-resistant resin films. However, the properties of a thin insulating base sheet made of such a fibrous material impregnated with a resin depend, to a great extent on the characteristics of the resin used. For instance, a thin laminate made by impregnating such a fibrous material with a conventional thermosetting resin such as an epoxy resin or phenolic resin and then bonding it to a metal foil is rigid and brittle, and hence, when the laminate is assembled in the folded form into flexible printed circuit board, a fatal difficulty results such as breaking of the circuit or the like. On the other hand, impregnation with a thermoplastic resin affords flexibility but deteriorates the heat resistance and causes another difficulty in connecting the printed circuits by use of an eutectic solder.

The flexibility of a thermosetting resin depends largely on the crosslinking density of the cured resin. In a system of, for example, a conventional epoxy resin and a curing agent, when the crosslinking density is kept low by adjusting the amount of the curing agent, the flexibility increases whilst unreacted epoxy resin remains in the cured resin or the intermolecular bond becomes loose, whereby the cured resin becomes susceptible to attack of those chemicals and solvents which are necessarily used in working on the printed circuit board. Similarly, when an epoxy compound of a low molecular weight, generally known as a flexibility-imperting agent, is simply added to a system of a conventional epoxy resin and a curing agent, the flexibility is improved while the heat resistance and chemical resistance become inferior. As mentioned above, since the properties required for a resin for flexible printed circuit base board, that is, the flexibility on one hand and the heat resistance and chemical resistance on the other hand are contradictory to each other, it has been very difficult to find a resin composition having these properties altogether.

For manufacturing a flexible metal-clad laminate in which the base sheet is a fibrous base material, it is possible to adopt a method in which the base is bonded to the metal foil by heating them together in a hot platen-press for a period of 0.5 to 3.0 hours, as in the production of conventional rigid laminates. However, since the starting materials are usually available in the form of webs, if it is possible to manufacture the laminate by application of a continuous process in which the base material is impregnated with the resin composition, and thereafter passed together with a metal foil through between hot rolls to effect bonding, the course of manufacture could be simplified, the production speed could be increased and a continuous treating method could be applied to subsequent steps for manufacturing printed circuits, and hence, a great economical advantage could be obtained. For this purpose, it is necessary that the resin composition cures in a bonding time far shorter than in the case of hot press method, i.e. as short as about 0.5 to 5.0 seconds or so, whereby to the resulting laminate are imparted important properties required for printed circuits, such as strong adhesive strength, excellent resistance to heat and chemicals, and excellent electrical properties. However, because with conventional phenol resin or epoxy resin curing agent systems, the curing time is long, the above-said continuous process employing a roll-laminator cannot be applied. When an epoxy resin is used in combination with a low temperature-type curing agent such as aliphatic amine, curing is fast, but the resin is hardly kept in the B-stage which is necessary to allow the resin to flow properly at the time of roll-laminating and also the cured resin is poor in chemical resistance and heat resistance.

Thus, when conventional resin compositions are used, it is quite difficult to obtain a metal-clad laminate based on a fibrous base material, which meets the severe requirements for flexible printed circuits, and there has been found no resin composition applicable to a continuous process employing the roll-laminating method.

This invention provides an excellent resin composition free from the aforesaid various defects of conventional compositions, which composition can impart an excellent flexibility, chemical resistance, and heat resistance to the base sheet and which can also be suited because of its rapid curability, to a continuous roll-laminating procedure. This invention also provides a method for obtaining a novel and economically advantageous base board material which has highly balanced fundamental characteristics required for flexible printed circuits, by impregnating an electrically insulating fibrous base material with the said resin composition and bonding the impregnated fibrous base material to a metal foil.

The resin composition for use in this invention comprises as the essential constituents a mixture of 100 parts by weight of at least one polyepoxy compound having at least 2 epoxy groups in the molecule and 10 to 300 parts by weight of at least one of the following acid-cntaining, high molecular weight, curing agents:

Copolymer A: copolymer of an aromatic vinyl compound with maleic anhydride, which contains at least 30 mole percent of maleic anhydride structural units in the molecule;

Copolymer B: alkyl partial ester of said copolymer A;

Copolymer C: copolymer of an aromatic vinyl compound with an alkyl maleate, which contains at least 30 mole percent of the monoalkyl maleate structural units in the molecule; and Copolymer D: copolymer of an aromatic vinyl compound with maleic anhydride and an alkyl maleate, which contains at least 30 mole percent, in total, of maleic anhydride structural units and monoalkyl maleate structural units in the molecule.

Owing to the maleic anhydride group or the carboxyl group contained in the molecule, these copolymers A, B, C, and D are such high molecular weight substances that are highly reactive with the polyepoxy compound, and, in themselves, stable thermally and chemically, and also excellent in electrical properties.

With a system comprising a conventional epoxy compound and a curing agent of a low molecular weight, the complete curing results in an increased crosslinking density, and a decreased flexibility, and the reduction in crosslinking density for the purpose of imparting flexibility results in reduction in both heat resistance and chemical resistance. Thus, these properties are inconsistent with each other. To the contrary, the copolymers A, B, C, and D for use in this invention are high molecular weight curing agent, and hence, when they are reacted with the polyepoxy compounds, the molecular weight between the resulting crosslinkages is high even after complete curing, and therefore, the cured product is excellent in flexibility as well as stable against chemicals, solvents, and heat. The base board obtained by impregnating a fibrous base material with the resin composition and then curing the resin has a flexibility in combination with resistance to heat and chemicals and electric properties in the consistent state, required for flexible printed circuits. Among these copolymers, those containing a large amount of maleic anhydride or monoalkyl maleate structural units are highly reactive with the polyepoxy compounds, and hence, the resin composition containing said copolymers as curing agents becomes extremely rapid-curing and can be kept in a stable B-stage at low temperatures. Therefore, it is suitable as an impregnant for use in a fibrous base material which after impregnation can be bonded to a metal foil in a short period of time by means of hot rolls. Thus, the present resin composition contribute to the first establishment of a continuous process for manufacturing a laminate for flexible printed circuits using an epoxy resin. When used in an ordinary press-laminating procedure, the rapid curability of the present resin composition enables to shorten the time of bonding under applied heat and pressure and to increase the number of production cycles.

The aromatic vinyl compounds in the copolymers A, B, C, and D are styrene, styrene derivatives such as methylstyrene, dimethylstyrene, ethylstyrene, $\alpha$-methylstyrene, $\alpha$-methyl-p-isopropylstyrene, and divinylbenzene; and halogenated styrene and styrene derivatives. A copolymer containing two or more aromatic vinyl compounds may also be used.

The copolymer A is obtained by copolymerization of such an aromatic compound with maleic anhydride and contains in its molecule at least 30 mole percent, preferably at least 35 mole percent, of the maleic anhydride structural units.

The copolymer B is obtained by partial esterification of the copolymer A with an aliphatic alcohol and may contain in the molecule structural units of maleic anhydride, maleic acid, monoalkyl maleate, and dialkyl maleate, and the degree of esterification is preferably 50 mole percent or less of the total amount of maleic anhydride structural units.

The copolymer C is obtained by copolymerization of an aromatic vinyl compound with a monoalkyl maleate or copolymerization of an aromatic vinyl compound with a monoalkyl maleate and dialkyl maleate, and contains in the molecule at least 30 mole percent, preferably at least 50 mole percent, of monoalkyl maleate structural units.

The copolymer D is obtained by copolymerization of an aromatic vinyl compound with maleic anhydride and a monoalkyl maleate and/or a dialkyl maleate and contains in the molecule at least 30 mole percent, preferably at least 40 mole percent of the maleic anhydride structural unit or the sum of structural units of maleic anhydride and of monoalkyl maleate.

The alkyl groups in the alkyl esters of maleic acid in the copolymers B, C, and D are those having 1 to 20, preferably 1 to 10, carbon atoms, such as methyl, ethyl, n-propyl, isopropyl, n-butyl, isobutyl, tert-butyl, n-pentyl, n-hexyl, tert-amyl, n-heptyl, isooctyl, 2-ethyl-1- hexyl, n-nonyl, and n-decyl groups. The copolymers C and D may contain two or more different alkyl groups.

In order that the resin composition of this invention may have a favorable reactivity with the polyepoxy compound and impart to the cured resin an excellent heat resistance and chemical resistance, the proportion of structural units of maleic anhydride and/or monoalkyl maleate in the copolymers A, B, C, and D is critical and if the proportion is below 30 mole percent, the base sheet obtained by use of a resin composition containing such copolymers is unsatisfactory in chemical resistance at the time of processing of printed circuits and also unsatisfactory in soldering heat-resistance at the time of assembling of the resulting printed circuits; and the curing time of said resin composition is too long to be used even in the press-laminating procedure.

Although depending upon the reactivity of the copolymers A, B, C, and D, the ratio of these copolymers to the polyepoxy compound may be freely selected in the range of 10 to 300 parts, preferably 30 to 200 parts, by weight per 100 parts by weight of at least one polyepoxy compound. Among the copolymers, the copolymer A is the highest in reactivity and when it is used alone for only the polyepoxy compound, 30 to 100 parts by weight of the copolymer A is sufficient, while when the resin composition contains other reactive components, a larger amount of the copolymer A may be used or the copolymer B, C, or D may be used together with the copolymer A, to adjust the curing time, control the balance of other characteristics or improve the flow of the resin composition in the laminating step. Although an amount of 30 to 200 parts by weight of the copolymer B, C, or D is preferred when such a copolymer is used alone for the polyepoxy compound, the amount may be increased up to 300 parts by weight when the resin composition contains other reactive components. When the copolymer A, B, C, or D or mixtures thereof are used in an amount of less than 10 parts by weight per 100 parts by weight of the polyepoxy compound, a sufficiently cured product cannot be obtained while when the amount exceeds 300 parts by weight, the cured resin composition becomes defective in chemical resistance and adhesive strength. The number-average molecular weight of the copolymer to be used may be 1,000 to 60,000 or thereabout, preferably 2,000 to 30,000.

The polyepoxy compounds having at least 2 epoxy equivalent of these compounds may be 100 to 4,000 or thereabout, preferably 100 to 1,000 or thereabout.

Testing of the polyepoxy compound is conducted in the following way: A piece of glass cloth, 0.1 mm in thickness, is impregnated with a mixture of 100 parts by weight of a polyepoxy compound to be tested and 100 parts by weight of a styrene-moleic anhydride copolymer (containing 50 mole percent of maleic anhydride structural unit) included in the copolymer A, dried and then heated and pressed by means of a hot press to obtain a completely cured specimen. If the specimen shows a folding endurance of 100 or higher in terms of number of foldings as measured according to the testing method for folding endurance, specified in JIS P 8115, the polyepoxy compound used as the test sample is preferable for the object of this invention. The polyepoxy compound which shows such a folding endurance is herein referred to as "flexible polyepoxy compound".

The polyepoxy compounds which meet the definition given above include Epikote 871 (a registered trademark for diglycidyl ester of dimer acid of Shell Chemical Corp.), Epikote 872 (a registered trademark for modified diglycidyl ester of dimer acid of Shell Chemical Corp.), DER 732 (a registered trade mark for modified diglycidyl ester of dimer acid of Shell Chemical Corp.), DER 732 (a registered trade mark for polyalkylene glycol diglycidyl ester of Dow Chemical Co.), Adeka Resin EP 4000 (a registered trademark for diglycidyl ether of an adduct of bisphenol-A and alkylene oxide of Asahi Denka Kogyo Co.), Epiclon 1030 (a registered trademark for polyepoxy compound of ether-ester type of Dai Nippon Ink Co.), and Adeka Resin EPU-10 (a registered trademark for urethane-modified polyepoxy compound of Asahi Denka Kogyo Co.). In this invention, it is preferable that 20% by weight or more of such a flexible polyepoxy compound be contained in the polyepoxy comcompound, that is, 100 parts by weight of a preferable mixture of polyepoxy compounds contain 20 to 100 parts by weight of a flexible polyepoxy compound selected in the abovesaid way and 0 to 80 parts by weight of other common polyepoxy compounds.

Among the said flexible polyepoxy compounds, particularly preferred are those epoxy compounds of the polyether type which are represented by the general formula,

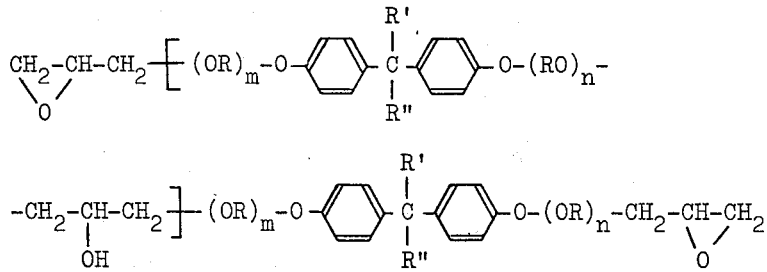

groups in the molecule, which are used in this invention, include common epoxy compounds such as diglycidyl ethers derived from bisphenols or halogenated bisphenols; cycloaliphatic polyepoxy compounds; glycidyl ethers of novolak resins, polyphenols, or polyhydroxyphenols; glycidyl ethers or esters derived from aromatic hydroxycarboxylic acids or aromatic dicarboxylic acids; diglycidyl esters of dimer acids; and diglycidyl ethers of polyalkylene glycols. The epoxy wherein R is an alkylene group having 2 to 4 carbon atoms, R' and R'' are hydrogen atoms or alkyl groups having 1 to 5 carbon atoms, and m and n are integers of 1, 2, or 3, because such a polyether-type epoxy compound is highly flexible owing to its molecular structure and the cured resin is stable against heat and chemicals and also excellent in electrical properties. Moreover, such a polyepoxy compound is highly reactive and when used in combination with the present acid-containing, high molecular weight curing agent, the reaction is apt to keep the B-stage. Since such a resin composition is excellent in both rapid curability and flow property when heated, it is particularly suitable for use in the continuous manufacture of a metal-clad laminate by the short-time bonding procedure using hot rolls.

In order to increase both the adhesion to a metal foil and the flexibility of the impregnated base sheet upon curing, the resin composition of this invention can be blended with the following components as long as the heat resistance and chemical resistance of the laminate are not impaired:

1. A reactive epoxy diluent having in the molecule at least one epoxy group.
2. An acrylonitrile-butadiene copolymer containing 25 to 50% by weight of the acrylonitrile component
3. A mixture comprising a high molecular weight saturated linear polyester resin obtained by polycondensation of a dibasic acid with a dihydric alcohol; and a polyisocyanate compound having in its molecule at least 2 isocyanate groups.

Any of the above components may be incorporated in an amount of 5 to 70 parts by weight per 100 parts by weight of the aforesaid polyepoxy compound.

The reactive epoxy diluent of the component (1) is a low molecular weight mono- or polyepoxy compound usually added to an epoxy resin to reduce the viscosity, such as, for example, glycidyl ethers of alkyl-, aryl-, aralkyl-, or aryloxy-alcohols; diglycidyl ethers of alkylene glycols; glycidyl esters of saturated or unsaturated aliphatic acids; and epoxides of alkyl- or aryl-olefins, the number-average molecular weight of these compounds being 100 to 2,000 or thereabout. Preferably compounds are butyl glycidyl ether, aryl glycidyl ethers, butanediol glycidyl ether, hexanediol glycidyl ether, phenyl glycidyl ether, cresyl glycidyl ether, glycidyl ester of acrylic acid or methacrylic acid, and styrene oxide.

Since said compounds have a structure closely related to that of monomers of the epoxy resin, they have good compotibility and reactivity with the polyepoxy compound. They improve the cured resin in flexibility by decreasing the crosslinking density, and in adhesive strength to a metal foil etc., by decreasing the cohesion at the interface. However, the amount to be added is critical. If the amount added per 100 parts by weight of the polyepoxy compound is less than 5 parts by weight, the improvement in flexibility and adhesive strength becomes insufficient, while if it exceeds 70 parts by weight, the cured resin becomes deteriorated in heat resistance and chemical resistance due to residual unreacted diluent and decreased intermolecular force. Therefore, a preferred amount is within the range from 5 to 40 parts by weight per 100 parts by weight of the polyepoxy compound.

The acrylonitrile-butadiene copolymer of the component (2) to be used is that of a relatively high acrylonitrile content, said content being 25 to 50% by weight based on the total weight of the copolymer. Such copolymers have favorable compatibility with the present resin composition and impart to the latter a high adhesive strength particularly to a metal foil resulting from the polarity of a CN radical. The fibrous base sheet impregnated with a resin composition containing such a copolymer is markedly improved in flexibility. If the acrylonitrile content of the copolymer is less than 25% by weight, compatibility with the adhesive composition becomes poor, while if said content exceeds 50% by weight, deterioration in electrical properties results. A favorable acrylonitrile content falls in the range of from 30 to 45% by weight. The amount to be added is also critical. If the amount added per 100 parts by weight of the polyepoxy compound is less than 5 parts by weight, the impovement in flexibility and adhesive strength becomes insufficient, while if it exceeds 70 parts by weight, the cured resin becomes deteriorated in heat resistance and electrical properties. A favorable amount to be added falls in the range of from 5 to 50 parts by weight.

The polyester resins of the component (3) are linear polyester resins obtained by polycondensation of aromatic or cycloaliphatic dicarboxylic acids such as, for example, terephthalic acid, isophthalic acid, and hexahydroterephthalic acid or aliphatic dicarboxylic acids having 4 to 12 carbon atoms such as adipic acid, sebacic acid, and azelaic acid, with aliphatic dihydric alcohols such as ethylene glycol or dihydric aryl or aralkyl alcohols such as resorcinol and p-xylene glycol; those which are obtained by co-condensation using two or more dicarboxylic acids or glycols are also included. These polyester resins to be used have a number-average molecular weight of 5,000 to 60,000 or thereabout, preferably 8,000 to 40,000 or thereabout.

The polyisocyanate compounds to be used include, for example, tolylene diisocyanate, diphenylmethane diisocyanate, m-phenylene diisocyanate, hexamethylene diisocyanate, triphenylmethane triisocyanate; reaction products of trimethylolpropane and tolylene diisocyanate; those polyisocyanate compounds which have their isocyanate groups blocked with a phenol or the like; and polyurethane prepolymers obtained by reacting an excess of these polyisocyanates with polyols. The mixing ratio of such a polyisocyanate to the aforesaid polyester resin is preferably 1 to 20 parts by weight to 100 parts by weight of the polyester resin, depending chiefly on the chemical equivalent of the reactants.

When added to the present resin composition, such a polyester resin-polyisocyanate component does not disturb the reaction between a polyepoxy compound and an acid-containing, high molecular weight curing agent, which are the main components of the resin composition, and cures uniformly by the reaction promoted by heating, thereby imparting distinguished adhesive strength, flexibility, and improved electrical properties to the cured resin. The resin composition incorporated with the said component is suitable for obtaining a flexible laminate for printed circuits having a high folding endurance by applying to an insulating fibrous base material. The amount of the said component to be added is critical in relation to other properties. If the amount added per 100 parts by weight of the polyepoxy compound is less than 5 parts by weight, the improvement in flexibility and adhesiveness becomes insufficient, while if it exceeds 70 parts by weight, heat resistance of the cured resin is deteriorated. A favorable amount to be added is within the range from 5 to 50 parts by weight per 100 parts by weight of the polyepoxy compound.

In this invention, the components (1), (2), and (3) may be used in combination of two or more. Among these three components, there is no particular interaction which is harmful to the uniform reactions of the resin composition as a whole. The addition of such a combination to the system of polyepoxy compound and acid-containing, high molecular weight curing agent enables to impart to the cured resin highly balanced properties owing to synergistic effects of the components. The amount of such a combination to be added to the resin composition is critical similarly to the case of adding each component alone. When the components (1), (2), and (3) are added each in an amount of 5 to 70 parts by weight per 100 parts by weight of the polyepoxy compound, the sum of the components added should be kept below 150 parts by weight. If the sum exceeds 150 parts by weight, the resin composition is deteriorated in heat resistance, chemical resistance, and, in addition, rapid curability which is one of the characteristic features of the present resin composition. A favorable amount of the combined components to be added is up to 140 parts by weight per 100 parts by weight of the polyepoxy compound.

Unless the properties are impaired, the present resin composition may be blended with, if necessary, small amounts of other curing agents for epoxy resin, curing accelerators, flame retardants such as halogen compounds and antimony trioxide, inorganic fillers, colorants, coupling agents, etc. By the addition of such additives, the resin composition can be adjusted so as to make the printed circuit board suitable for special uses.

In impregnating an insulating fibrous base material with the resin composition of this invention, all components of the composition are dissolved in a common solvent such as acetone, methyl ethyl ketone, toluene, xylene, dimethylformamide, tetrahydron, or methyl Cellosolve, or a mixture thereof, and mixed. The concentration is adjusted so as to be suitable for applying to the base material, though a preferable concentration is in the range of from 10 to 50%.

The insulating fibrous base materials to be used are glass cloth, glass mat, non-woven glass paper, craft paper, linter paper, polyamide paper, non-woven polyester fabric, asbestos paper, cotton cloth, paper and fabrics made from blended fibers, and the like. These base materials can be uniformly impregnated with a resin and have excellent heat resistance, excellent dimensional stability, and excellent mechanical, chemical, and electrical properties, which are required for the printed circuit board. If necessary, these base materials may be treated with coupling agents of the silane-type or the chromium-type to improve the affinity between the base material and the resin and the resin composition. The thickness of the base material is preferably 0.02 to 0.3 mm. The base material of such a thickness has a flexibility and a stiffness which meet the ordinary requirements for flexible printed circuits. A single sheet of the base material is generally used in a laminated base board but multiple sheets of the resin-impregnated base material can be laminated.

The metal foils to be used are conductive foils of copper, aluminum, tin, nickel, nickel-chrome, beryllium-copper, etc., a preferable thickness being 15 to 110 $\mu$ or thereabout. The general-purpose metal foil is copper foil obtained by electrolysis or by rolling. In order to further improve the adhesive strength of the printed circuit board, the surface of a metal foil to be bonded may be subjected to a mechanical treatment such as sanding or to a chemical treatment with a chromic acid-sulfuric acid mixture or the like. If necessary, the surface of a metal foil to be bonded may also be coated with common adhesives for metal of the phenolic-, epoxy-, butyrol-, rubber-, polyester-, and polyurethane-type, and mixed-types. A high adhesive strength is sometimes obtained by use of such a metal foil coated with an adhesive. A preferable thickness of the adhesive layer is about 20 ± 10 $\mu$. The overall thickness of a metal-clad laminate obtained according to this invention depends on the intended use of the finished printed circuits and is subject to no other particular restrictions. A preferable thickness, including that of the metal foil, falls in the range of from about 0.05 mm to about 0.8 mm. The thickness of the board excluding the metal foil is 0.03 to 0.5 mm or thereabout.

A method for manufacturing a laminate for printed circuits by use of the present resin composition is explained below.

By using a coating-and-drying equipment an insulating fibrous base material is impregnated with a varnish obtained by dissolving the resin composition in the aforesaid solvent, and then dried at 130° ± 40°C. for 1 to 30 minutes to remove the solvent by evaporation until the resin composition changes into a semi-cured state (B-stage). The resin content of the impregnated base material (prepreg) in such a stage is 20 to 70%, preferably 30 to 60%, by weight based on the total weight of the prepreg. A sheet of the prepreg or a pile of multiple sheets of the prepreg, 30 to 500 $\mu$, preferably 50 to 300 $\mu$ in overall thickness, is covered with a metal foil on one side or both sides, then heated under pressure by passing between hot rolls of a laminator or by keeping pressed between hot plates of a press, and subsequently cooled to obtain a laminate for flexible printed circuits. Heating and pressing conditions: temperature, 100° – 200°C.; pressure, 5 – 200 kg/cm$^2$; heating period of time, 0.5 – 10 seconds (with rolls), 15 – 180 minutes (with a press). Preferable conditions: temperature, 120° – 180°C.; pressure, 10 – 120 kg/cm$^2$; heating period of time, 0.5 – 5 seconds (with rolls), 30 – 120 minutes (with a press).

When the present resin composition is used, the heating and pressing time can be markedly shortened as compared with the conventional manufacturing conditions of a metal-clad laminate. For instance, a resin composition containing a maleic anhydride-aromatic vinyl compound copolymer (one of the acid-type polymeric curing agents of this invention), or a resin composition containing said copolymer and, in addition, an alkyl maleate-aromatic vinyl compound copolymer can be used in the short-time ( ≥ 10 seconds) roll-laminating process. Moreover, when said resin composition is used in the press-laminating process, bonding can be completed in less than 120 minutes, in most cases less than 90 minutes, whilst a bonding time of at least 120 minutes, in most cases 150 to 200 minutes, is required in manufacturing conventional thermosetting resin laminate. Such an advantage of the resin composition of this invention is important in view of cost and productivity in manufacturing a laminate.

In the most advantageous roll-laminating process, lamination is carried out by use of an equipment of the type generally called "dry-laminator," in which a coating-and-drying unit is coupled to a laminating unit. An insulating fibrous base material in the web form is impregnated in the roll-coating zone with a varnish coating a resin composition and then evaporating the solvent in the drying zone, to form the B-stage resin composition. The thus treated base material, as such or, if necessary, together with a releasable plastic film, is sent to the press-roll zone where the base material comes into close contact with a metal foil with or without an adhesive, sent from another roll, and pressed with heating, while traveling continuously, to form a laminate which is then cooled and taken off by means of a winder. Such a sequence of steps are operated in a perfectly continuous way by interlocking rolls in the respective parts of the equipment.

In such an equipment, in order that the insulating fibrous base material impregnated with the present resin composition may effectively manifest its adhesive strength to a metal foil and that the resin may acquire sufficient flow to give a laminate having good appearance, it is preferable to use a metal roll such as a steel roll with, if necessary, a coating of a releasing resin such as Teflon, and a rubber roll such as silicone rubber roll, said metal roll and rubber roll forming a pair of press rolls; and it is preferable to carry out the bonding by passing the prepreg together with the metal foil through the gap between two rolls forming a press roll pair in such a manner that the prepreg contacts with the metal roll, if necessary, through a releasing film, and the metal foil contacts with the rubber roll so as to wrap the rubber roll from the position on the circumference of the rubber roll for $\pi/4$ or more radians towards the contact line of both rolls. Such a procedure is highly advantageous for the continuos laminating of an insulating fibrous base material impregnated with the resin composition of this invention because the procedure imparts to the laminate a high adhesive strength, an excellent appearance, and excellent properties, such as heat resistance and chemical resistance, by preventing the formation of wrinkles on the laminate which is due mainly to thermal expansion of the metal foil, having a higher stiffness, in the contact zone of both rolls, and also by increasing heat condition to the prepreg by sustained heating of rapidly traveling metal foil, which results in acceleration of fusion, adhesion and curing reaction.

Although the present resin composition cures sufficiently in such a short-time laminating to impart to the laminate those fundamental properties which are required for printed circuit boards, it is also preferable to subject the laminate thus obtained to a post-baking treatment at 130° ± 40°C. for about 30 to 180 minutes in, for example, a drying oven. By such a treatment the laminate is further improved in heat resistance and chemical resistance, and also in dimensional stability owing to removal of the strain.

Evaluation of the flexibility of the flexible metal-clad laminate thus obtained is conducted by means of a MIT-type folding endurance tester conforming to the method specified in JIS P 8115. Testing conditions: radius of curvature of the edge contour over which the specimen is folded, 0.8 mm; angle through which the specimen is folded back and forth, 135° back, 135° forth, 270° in total; rate of folding, 175 times/minute; tension, 100 g/mm. The base sheet of the laminate removed of the conductive foil by etching is cut to a size of 15 mm × 110 mm, attached to the chuck, and repeatedly folded back and forth until the specimen is ruptured, the number of foldings being recorded.

For instance, an ordinary epoxy-glass cloth base sheet, 200 $\mu$ or less in thickness, for printed circuits fails at 1 to 15 foldings at maximum 20 foldings, whereas the epoxy-glass cloth base sheet, 200 $\mu$ or less in thickness, given a flexibility according to this invention shows more than 100 foldings, and in many cases more than 500 foldings. This clearly proves the advantage of the present resin composition.

Owing to its excellent folding endurance, the flexible base board for printed circuits obtained by applying a specific resin composition of this invention to an insulating fibrous base material is capable of withstanding a severe folding, the radius of curvature at the fold being 1 mm, and has an advantage of being assembled three-dimensionally in the folded state within a narrow space in miniaturized electronic instruments.

The present base board is also sufficiently resistant to a variety of organic solvents and to treatments with chemicals such as acids, alkalis, etching solution, and plating solution, which are used in fabrication of printed circuits, and excellent in adhesive strength, electrical properties, and dimensional stability. Therefore, such a base board suitable for use in, beside general field, high-precision printed circuit having minute conductor, and in a wiring board for those devices which rise high temperatures while operating. Particularly, the heat resistance of the present base board is in such a level that it permits solder-connecting at a temperature above 260°C. by use of a tin-lead (60 : 40) eutectic solder, which is difficult in the case of those printed circuit boards the base of which is a conventional plastic film such as polyester film, polyvinyl chloride film, etc. Accordingly, such a printed circuit board of the present invention can be connected to other wiring boards, components, and wirings in a way similar to that in the case of common printed circuit boards of the epoxy resin-glass cloth base and is excellent in workability and reliability in assembling the board onto equipments. Further, quite different from conventional printed circuit boards of the film base, the present base board has a stiffness sufficient for bearing about 20 g of components for a long period of time so that a circuit board in which circuits and lead-wirings are integrated may be designed.

With regards to production cost, since the present metal-clad laminate is in a comparable level regarding material cost with a conventional metal-clad epoxy resin-glass cloth laminate, and can be manufactured at low cost by a continuous process based on a roll-to-roll lamination, which has been difficult to apply in the case of a conventional thermosetting resin laminate, the present metal-clad laminate has an advantage over the laminate of the heat-resistant film base, such as polyimide film base or polyamide-imide film base.

As stated in the foregoing, this invention provides a novel and practically valuable laminate for flexible printed circuits, which has excellent flexibility, heat resistance, chemical resistance, and other necessary characteristics and, in addition, an advantage of low cost.

Because of its excellent flexibility, heat resistance, adhesive strength, flow property, and electrical properties, a prepreg obtained by impregnating a fibrous insulating sheet material with the resin composition of this invention and then semi-curing is suitable as a cover-lay usually applied for the purpose of insulation, corrosion inhibition, and protection against folding of the conductor in a flexible printed circuit. A thin-grade fibrous base material, around 0.02 to 0.1 mm in thickness, is impregnated with the resin composition and used in cover-lay process by means of rolls or a press to obtain a covered printed circuit which is susceptable to solder-connecting.

The present prepreg is also suitable as an interlayer adhesive sheet for use in integrated lamination of rigid printed circuits with flexible printed circuits or in multi-lamination of flexible printed circuits with one another, such lamination being made for the purpose of densification of circuits and simplification of connecting. The adhesive strength, flow property, and heat resistance of the present prepreg can meet satisfactorily the quality requirements for such printed circuits.

The invention is illustrated below in detail with reference to Examples, but the invention is not restricted thereto.

EXAMPLE 1

A varnish containing 30% of a resin composition was prepared by dissolving in methyl ethyl ketone 60 parts by weight of a bisphenol-A-based epoxy resin (Epikote 828, a registered trademark of Shell Chemical Corp.), 40 parts by weight of a diepoxy compound having an epoxy equivalent of 320, obtained by condensation of epichlorohydrin with a dihydric alcohol formed by reacting bisphenol-A with ethylene oxide using potassium hydroxide as catalyst, 120 parts by weight of a maleic anhydride-strene-dimethylstyrene copolymer containing 50 mole percent of maleic anhydride, and 30 parts by weight of butanediol.

A portion of the resin varnish thus obtained was placed on a hot plate heated at 150°C. and the time elapsed after the solvent had been evaporated till the resin hardened was measured and found to be 10 seconds (gel time).

A web of glass cloth, 100 $\mu$ in thickness, treated with $\gamma$-glycidoxypropyltriethoxysilane, was impregnated with the varnish by means of a roll-laminator in which a coating-and-drying unit is coupled to a laminating unit, and then dried at 130°C. for 5 minutes to obtain a impregnated glass cloth having a semi-cured resin (B-stage) content of 40% by weight. The impregnated glass cloth together with a releasing polyester film, 12 $\mu$ in thickness, and a copper foil, 35 $\mu$ in thickness, was passed in one second through between a metal roll and a rubber roll constituting a press roll pair in such a manner that the impregnated glass cloth contacts with the metal roll through the releasing film whilst the copper foil comes in contact with the rubber roll so as to wrap the rubber roll from the position on the circumference of the rubber roll for $2\pi/5$ radians towards the contact line of both rolls, whereby bonding is effected between both rolls at 150°C. under a pressure of 15 kg/cm² to form a flexible copper-clad laminate.

Properties of the copper-clad laminate thus obtained were as shown in Table 1. In spite of shorttime bonding under low pressure, the flow and adhesion to copper foil of the resin were excellent; chemical resistance and electrical property of the laminate were also excellent; and folding endurance was 100 times as high as that of a conventional rigid laminate of an epoxy resin and thin-grade glass cloth, indicating that the present laminate can be used as the base board for flexible printed circuits which is used as folded tightly. After having been immersed in a solder bath at 280°C. for 30 seconds, the laminate showed no change, indicating that the laminate is resistant to soldering under conventional conditions.

To the contrary, when a conventional epoxy resin composition was used (Comparative Example), the short-time roll-lamination was impossible owing to too long a gel-time, and the laminate obtained by the press method was markedly inferior in folding endurance, indicating that because of its poor reliability, such a laminate is practically unsuitable for those printed circuits which are connected in the folded state.

EXAMPLE 2

A varnish containing 30% by weight of a resin composition was prepared by dissolving the following components in methyl ethyl ketone and mixing thoroughly. The gel time of this resin varnish was 12 seconds at 150°C.

| | | Part by weight |
|---|---|---|
| 1. | Bisphenol-A-based polyepoxy compound (Epikote 1001) | 40 |
| 2. | Flexible polyepoxy compound (diglycidyl ether of bisphenol A-propylene oxide (1:2 mole) adduct) | 60 |
| 3. | Maleic anhydride-$\alpha$-methyl-styrene (45:55 mole-%) copolymer | 120 |
| 4. | Phenyl glycidyl ether | 30 |

In the same manner as in Example 1, a web of glass paper, 50 $\mu$ in thickness, treated with $\gamma$-aminopropyltriethoxysilane, was impregnated with the varnish by means of a roll-laminator, and dried at 130°C. for 5 minutes to obtain an impregnated glass paper having a resin content of 40% by weight. The impregnated glass paper together with a releasing film and an aluminum foil, 50 $\mu$ in thickness, was passed between a pair of press-rolls in one second, thereby to effect bonding at 150°C., under pressure of 15 kg/cm² to obtain a flexible aluminum-clad laminate. Properties of the laminate thus obtained where as shown in Table 1. In spite of such a short-time bonding under a low pressure, the flow of the resin was favorable and the laminate was excellent in adhesive strength, chemical resistance, electrical properties, and heat resistance. The laminate was very flexible, can satisfactorily withstand sharp folding, the radius of curvature (R) of the fold profile being less than 1 mm, and had a stiffness sufficient for bearing small components.

EXAMPLE 3

A varnish containing 25% by weight of a resin composition was prepared by dissolving the following components in acetone and mixing thoroughly. The gel time of the resulting resin varnish was 20 seconds at 150°C.

| | | Part by weight |
|---|---|---|
| 1. | Flexible polyepoxy compound (Adeka Resin EP-4000, diglycidyl ether of bisphenol-A-alkylene oxide adduct, produced by Asahi Denka Kogyo Co.) | 100 |
| 2. | Isobutyl ester (esterification degree 40 mole percent) of maleic anhydride-dimethylstyrene (60:40 mole percent) copolymer | 100 |

In the same manner as in Example 1, a web of linter paper, 100 $\mu$ in thickness, was impregnated with the varnish by means of a roll-laminator, and dried at 130°C. for 6 minutes to obtain an impregnated linter paper having a resin content of 50% by weight. The impregnated paper together with a releasing film and a copper foil, 35 $\mu$ in thickness and coated with a phenol-modified rubber-base adhesive, was passed between press rolls in 2 seconds, at 160°C. under a pressure of 20 kg/cm², to form a flexible copper-clad laminate. The properties of the laminate were excellent as shown in Table 1. It is seen that a flexible printed circuit board with sufficient flexibility can be manufactured by use of a paper material, which has heretofore been difficult to obtain.

EXAMPLE 4

The following components were dissolved and mixed in a toluene-methyl ethyl ketone (1 : 1 by volume) solvent mixture to prepare a varnish containing 20% by weight of the resin composition. The varnish had a gel time of 48 seconds at 150°C.

|   |   | Part by weight |
|---|---|---|
| 1. | Novolak-type polyepoxy compound (DER 154) | 80 |
| 2. | Flexible polyepoxy compound (Adeka Resin EP 4000) | 20 |
| 3. | Monoisopropyl maleate-styrene-$\alpha$-methylstyrene (50:33:17 mole percent) copolymer | 200 |
| 4. | Cresyl glycidyl ether | 10 |
| 5. | Acrylonitrile-butadiene copolymer (acrylonitrile content, 30 % by weight) | 45 |

By using a coating-drying equipment a web of polyamide paper, 250 $\mu$ in thickness, was impregnated with the varnish and dried at 150°C. for 5 minutes to obtain an impregnated polyamide paper with 45% by weight resin content. Single sheet of the impregnated polyamide paper and a nichrome foil, 40 $\mu$ in thickness, were laid one over the other, placed between two stainless steel plates, and heated by means of a hot platen-press at 160°C., under a pressure of 80 kg/cm², for 90 minutes to effect bonding and to obtain a flexible nichrome-clad laminate. Properties of the laminate were as shown in Table 1. In spite of using a thick-grade fibrous sheet material, the laminate was sufficiently flexible so that a flexible printed circuit with the laminate as its base can be mounted as laid in the folded state with a sharp edge, the radius of curvature (R) of its profile being as small as about 2 mm, yet the laminate had sufficient stiffness to bear the components.

EXAMPLE 5

The following components were dissolved in methyl ethyl ketone and mixed to prepare a varnish containing the resin composition in a concentration of 35% by weight. The resin varnish obtained had a gel time of 27 seconds at 150°C.

|   |   | Parts by weight |
|---|---|---|
| 1. | Brominated bisphenol-based epoxy compound (Epiclon 152) | 100 |
| 2. | Maleic anhydride-mono-n-pentyl maleate-styrene (20:20:60 mole percent) copolymer | 180 |
| 3. | Hexanediol diglycidyl ether | 40 |
| 4. | Antimony trioxide | 15 |

In the same manner as in Example 4, a web of glass mat for surfacing, 50 $\mu$ in thickness and treated with methacrylatochromic chloride was impregnated with the varnish, and dried at 150°C. for 7 minutes to obtain an impregnated glass mat with a resin content of 55% by weight. Three sheets of the impregnated glass mat and a copper foil, 70 $\mu$ in thickness, were placed one over the other and bonded together by means of a hot platen-press at 170°C. under a pressure of 100 kg/cm², the heating time being 120 minutes. Properties of the resulting flexible copper-clad laminate were as shown in Table 1. In spite of using a common polyepoxy compound, the laminate was sufficiently flexible so that a flexible printed circuit with the laminate as its base can be mounted as laid in the folded state with a sharp edge, R of its profile being as small as 2 mm, yet the laminate had sufficient stiffness to bear various components such as capacitors, IC, and the like. Further, the laminate had an excellent fire-retarding property corresponding to the rating VE-O according to the "Vertical inflammability test" of the Underwriters Laboratories, Inc., the average combustion time having been 5 seconds or less.

EXAMPLE 6

The following components were dissolved in tetrahydrofuran and mixed to prepare a varnish containing 17% by weight of the resin composition. The gel time of this resin varnish was 15 seconds at 150°C.

|   |   | Part by weight |
|---|---|---|
| 1. | Bisphenol-A-based polyepoxy compound (Epikote 1004) | 20 |
| 2. | Flexible polyepoxy compound (Adeka Resin EPU-10) | 80 |
| 3. | Maleic anhydride -$\alpha$-methyl-p-isopropyl-styrene (30:70 mole percent) copolymer | 40 |
| 4. | Monoethyl maleate-dimethylstyrene (30:70 mole percent) copolymer | 80 |
| 5. | Terephthalic acid-sebacic acid-ethylene glycol (25:25:50 mole percent) cocondensate | 50 |
| 6. | Tolylene diisocyanate | 5 |

A web of polyester non-woven fabric, 200 $\mu$ in thickness, was impregnated with the varnish by means of a roll-laminator in the same manner as in Example 1, and dried at 120°C. for 5 minutes to obtain an impregnated polyester nonwoven fabric with a resin content of 50% by weight. The impregnated polyester nonwoven fabric together with an aluminum foil, 100 $\mu$ in thickness, was passed between a metal roll having a Teflon coating on the surface and a silicone rubber roll, both rolls constituting a press roll pair, in one second, thereby to effect bonding at 170°C. and under a pressure of 25 kg/cm² and to obtain a flexible aluminum-clad laminate. As shown in Table 1, the laminate was excellent in various properties, could be used as a flexible printed circuits board which is mountable as laid in the folded state with a sharp edge, R of its profile being about 1 mm, and was resistant to solder-connecting at 260°C. by means of an eutectic solder, in spite of having a polyester non-woven fabric as its base.

EXAMPLE 7

The following components were dissolved in a solvent mixture comprising methyl ethyl ketone-tetrahydrofuran (2 : 1 by volume) and mixed to obtain a varnish containing 25% by weight of the resin composition. The resin varnish had a gel time of 33 seconds at 150°C.

| | | Part by weight |
|---|---|---|
| 1. | Bisphenol-A-based epoxy resin (Epikote 1001) | 50 |
| 2. | Flexible epoxy resin (Epikote 871) | 50 |
| 3. | Partial isooctyl ester (esterification degree, 50 mole percent) of maleic anhydride-dimethyl-styrene (60:40 mole percent) copolymer | 150 |
| 4. | Acrylonitrile-butadiene copolymer (acrylonitrile content, 40 % by weight) | 20 |
| 5. | Terephthalic acid-adipic acid-propylene glycol (30:20:50 mole percent) co-condensate | 50 |
| 6. | Triphenylmethane triisocyanate | 2 |

In the same manner as in Example 4, a web of glass cloth, 100 $\mu$ in thickness and treated with $\gamma$-glycidoxypropyltrimethoxysilane was impregnated with the varnish, and dried at 120°C. for 5 minutes to obtain an impregnated glass cloth having a resin content of 38% by weight. Three sheets of the impregnated glass cloth and a copper foil, 105 $\mu$ in thickness, were laid one over the other and pressed at 150°C. under a pressure of 120 kg/cm$^2$ for 60 minutes to obtain a flexible copperclad laminate. Properties of the laminate were as shown in Table 1. In spite of its relatively thick base sheet, the laminate had a good flexibility and could be used as a flexible printed circuit board which is mountable as laid in the folded state with a sharp edge, R of its profile being about 3 mm. Moreover, the present laminate could be laid with printed circuits loaded with parts similarly to a rigid base board.

EXAMPLE 8

The following components were dissolved in a solvent mixture comprising acetone and toluene (1 : 1 by volume) and mixed to obtain a varnish containing 40% by weight of the resin composition. The resin varnish had a gel time of 17 seconds at 150°C.

| | | Part by weight |
|---|---|---|
| 1. | Bisphenol-A-based polyepoxy compound (Epikote 1001) | 50 |
| 2. | Flexible polyepoxy compound (DER 732) | 50 |
| 3. | Maleic anhydride-$\alpha$-methyl-styrene (65:35 mole percent) copolymer | 40 |
| 4. | Acrylonitrile-butadiene copolymer (acrylonitrile content, 45 % by weight) | 15 |

In the same manner as in Example 1, a web of glass cloth, 50 $\mu$ in thickness and treated with $\gamma$-glycidoxypropyltriethoxysilane, was impregnated with the varnish by means of a roll-laminator, and dried at 120°C. for 5 minutes to obtain an impregnated glass cloth having a resin content of 55% by weight. The impregnated glass cloth together with a releasing film and a copper foil, 17 $\mu$ in thickness, were passed between the press-rolls in 1.5 seconds at 150°C. under a pressure of 15 kg/cm$^2$ to form a flexible copperclad laminate. As shown in Table 2, the laminate was excellent in various properties, particularly in folding endurance, and suitable for such use that after having been laid with intricated and precise circuits, the laminate was mounted as laid in the folded state with sharp edge, R of its profile being less than 1 mm.

EXAMPLE 9

The following components were dissolved in methyl ethyl ketone and mixed to prepare a varnish containing 20% by weight of the resin composition. The varnish had a gel time of 35 seconds at 150°C.

| | | Part by weight |
|---|---|---|
| 1. | Brominated bisphenol-based polyepoxy compound (Epikote 1045) | 100 |
| 2. | Monoethyl maleate-diethyl maleate-$\alpha$-methyl-p-methyl-styrene (50:25:25 mole percent) copolymer | 100 |
| 3. | Antimony trioxide | 15 |

In the same manner as in Example 4, a web of polyamide paper, 80 $\mu$ in thickness, was impregnated with the varnish, and dried at 130°C. for 7 minutes to obtain an impregnated polyamide paper with a resin content of 45% by weight. Two sheets of the impregnated polyamide paper and a nichrome foil were placed one over the other and pressed under a pressure of 60 kg/cm$^2$ and heated at 160°C. for 120 minutes to form a flexible nichrome-clad laminate. Properties of the laminate were as shown in Table 2. In spite of the use of a common polyepoxy compound, the laminate was excellent in flexibility and could be used as a flexible printed circuit board which is mountable as laid in the folded state with sharp edge, R of its profile being about 2 mm, while said board could be loaded with parts. The laminate was tested in accordance with the UL testing method mentioned in Example 5 and found that the average combustion time was below 25 seconds corresponding to an inflammability rating of VE-1.

EXAMPLE 10

The following components were dissolved in a solvent mixture comprising tetrahydrofuran and toluene (1 : 1 by volume) to prepare a varnish containing 30% by weight of the resin composition. The resin varnish has a gel time of 30 seconds at 150°C.

| | | Part by weight |
|---|---|---|
| 1. | Ether-ester type polyepoxy compound (Epiclon 1030) | 100 |
| 2. | Maleic anhydride-$\alpha$-methyl-styrene (35:65 mole percent) copolymer | 250 |
| 3. | Butyl glycidyl ether | 20 |
| 4. | Acrylonitrile-butadiene copolymer (acrylonitrile content, 25 % by weight | 30 |
| 5. | Terephthalic acid-ethylene glycol-propylene glycol (50:25:25 mole percent) co-condensate | 40 |
| 6. | Ap Stable (a registered trademark for blocked polyisocyanate of Japan Polyurethane Co.) | 1 |

In the same manner as in Example 1, a web of glass paper, 30 μ in thickness, treated with γ-aminopropyltriethoxysilane, was impregnated with a varnish and dried at 130°C. for 7 minutes to obtain an impregnated glass paper with a resin content of 40% by weight. The impregnated glass paper together with a releasing film and an aluminum foil, 20 μ in thickness were passed between the press rolls in 2 seconds, thereby to effect bonding at 160°C. under a pressure of 20 kg/cm² to obtain a flexible aluminum-clad laminate. As shown in Table 2, the laminate had well-balanced properties, particularly distinguished folding endurance and could be used as laid in the folded state with sharp edge having such a profile that R thereof is less than 1 mm.

COMPARATIVE EXAMPLE 1

A hundred parts by weight of a bisphenol-A-based polyepoxy compound (Epikote 1001) and 12 parts by weight of menthanediamine were dissolved in methyl ethyl ketone and mixed to obtain a varnish containing 30% by weight of the resin composition. The varnish had a gel time of 800 seconds at 150°C. In the same manner as in Example 4, a web of glass cloth, 100 μ in thickness, treated with γ-glycidoxypropyltriethoxysilane, was impregnated with the varnish and dried at 150°C. for 10 minutes to obtain an impregnated glass cloth of a resin content of 40% by weight. A sheet of the impregnated glass cloth and copper foil, 35 μ in thickness, were laid one over the other and pressed by means of a hot platen press for 80 minutes at 170°C. under a pressure of 80 kg/cm² to form a copper-clad laminate.

As shown in Table 2, adhesive strength, chemical resistance, and soldering heat-resistance of the laminate obtained above were comparable to those of the laminates obtained in Examples, whereas the folding endurance of the base sheet obtained above was so inferior that the laminate could not be used as a flexible printed circuit board which is mounted as laid in the folded state with a sharp edge, R of its profile being 1 to 2 mm.

COMPARATIVE EXAMPLES 2 TO 6

In the same manner as in Comparative Example 1, the same glass paper, linter paper, polyamide, paper, glass mat, and polyester nonwoven fabric as those used in Examples 2 to 6 were impregnated with the same resin composition comprising a polyepoxy compound and a curing agent as that used in Comparative Example 1, then dried, and laminated by means of a hot press to obtain metalclad laminates of the same construction as in Examples 2 to 6. Those laminates which were obtained were comparable in most of the properties to those obtained in Examples whereas so inferior in folding endurance of the base sheet that they could not be used as a flexible printed circuit board. In Table 3, folding endurance of the base sheets obtained in Comparative Examples was compared with that of the base sheets obtained in Examples.

COMPARATIVE EXAMPLES 7 to 9

In the same manner as in Comparative Example 1, several resin varnishes were prepared by adding flexibility-imparting agents to the same composition comprising an ordinary polyepoxy compound and curing agent as used in Comparative Example 1. Attempts were made to manufacture metal-clad laminates by means of a hot platen-press by using the said varnishes, a glass cloth, 100 μ in thickness, treated with γ-glycidoxypropyltriethoxysilane, and a copper foil, 35 μ in thickness. The results obtained were as shown in Table 4. By the addition of a low molecular weight glycidyl ether or an acrylonitrile-butadiene copolymer, the folding endurance was improved to some degree whilst the curing time of the resin composition was too long for the roll-laminating process, and the laminate obtained by the press method was markedly inferior in heat resistance and chemical resistance. When a polyester resin and a polyisocyanate were added to impart flexibility, the polyisocyanate reacted with the menthanediamine in the varnish to deposit insoluble substances and laminating was impossible.

EXAMPLES 11 AND 12

One hundred parts by weight of a flexible polyepoxy compound (Adeka Resin EP 4000) and 100 parts by weight of a maleic anhydride-α-methylstyrene copolymer containing 30 mole percent of maleic anhydride or 100 parts by weight of a monoethyl maleate-dimethylstyrene copolymer containing 30 mole percent of monoethyl maleate were separately dissolved in methyl ethyl keton and mixed to prepare a varnish of the resin composition. In the same manner as in Example 1, a web of glass cloth, 100 μ in thickness, treated with the same coupling agent as used in Example 1, was impregnated with the varnish and dried. A laminate obtained by bonding the impregnated glass cloth to a copper foil, 35 μ in thickness by the roll-laminating process was postbaked in a drying oven at 130°C. for 3.5 hours to obtain a flexible copper-clad laminate. As shown in Table 2, properties of the laminate met those required for the flexible printed circuits and folding endurance of the laminate was excellent. Gel time of the varnish showed the rapid curability suitable for the roll-laminating process.

COMPARATIVE EXAMPLE 10

One hundred parts by weight of the same flexible polyepoxy compound as used in Examples 11 and 12 and 17 parts by weight of menthanediamine were dissolved in methyl ethyl ketone and mixed to obtain a varnish. In the same manner as in Comparative Example 1, a piece of glass cloth, 100 μ in thickness, treated with the same coupling agent as used in Comparative Example 1, was impregnated with the varnish, dried, and bonded to a copper foil, 35 μ in thickness, by the press method to form a copper-clad laminate. As shown in Table 2, although favorable in most of the properties, the laminate was inferior in folding endurance and unsatisfactory for use in flexible printed circuit board. Gel time of the varnish obtained above was 180 seconds at 150°C. and unsuitable for the short-time rolllaminating process.

COMPARATIVE EXAMPLES 11 AND 12

One hundred parts by weight of the same flexible epoxy compound as used in Example 12 and 100 parts by weight of a maleic anhydride-α-methylstyrene copolymer containing 20 mole percent of maleic anhydride or 100 parts by weight of a monoethyl maleate-dimethylstyrene copolymer containing 20 mole percent of monoethyl maleate were dissolved in methyl ethyl ketone and mixed to obtain a varnish of the resin composition. In the same manner as in Comparative Example 1, a web of glass cloth, 100 μ in thickness, treated with the same coupling agent as used in Comparative Example 1, was impregnated with the varnish, dried and bonded to a copper foil, 35 μ in thickness, by the press method to form a copper-clad laminate. Although relatively favorable in folding endurance, the laminate was subject to attack of trichloroethylene and acetone, and had a soldering heat-resistance of 260°C. or lower, indicating that the laminate was unsuitable for use in the printed circuit board. In Table 5, folding endurance of the base sheet and gel time of the varnish were shown as compared with those of Examples.

As shown in Table 3, compared with the conventional epoxy resin composition (Comparative Examples 1 to 6) usually used in ordinary laminate for printed circuits, the resin composition of this invention (Examples 1 to 6) has markedly reduced gel time. Owing to such a reduced gel time, it has become possible to manufacture the fibrous sheet material-epoxy resin laminate not only by, of course, the customary press method, but also continuously by the short-time roll-laminating method. Further, as compared with the conventional rigid base sheet (Comparative Examples 1 to 6), the base sheet of this invention is markedly improved in folding endurance and the printed circuit board having such a base sheet is imparted with such a function that it can be laid in the folded state in assembling, permitting a three-dimensional wiring.

To the contrary, as shown in Table 4, the conventional epoxy resin composition cannot be improved to develop sufficient folding endurance even by incorporation of a flexibility-imparting agent; the quality of the base sheet is rather deteriorated by such additives. On the other hand, as shown in Tables 2 and 3, when a conventional curing agent is used with the flexible polyepoxy compound (Comparative Example 10), the folding endurance is not much improved and the gel time is not reduced so as to become suitable for the roll-laminating.

As mentioned above, the advantage of this invention is due chiefly to the acid-containing, high molecular weight curing agent. As shown in Table 5, both rapid curability and good folding endurance are found in Examples 11 and 12, whereas relatively favorable folding endurance, unsatisfactory gel time, and deterioration in other properties are shown in Comparative Examples 11 and 12. These facts show that the amount of the maleic acid-containing structural unit in the acid-containing, high molecular weight curing agent is critical.

EXAMPLE 13

By using the laminate obtained in Example 1, a flexible printed circuit with a circular land was fabricated by etching method. On the other hand the impregnated glass paper (prepreg) obtained in Example 2 was punched a hole at the portion corresponding to the land of the printed circuit, placed over the said flexible printed circuit so that both are properly mated, and the resulting composite was heated and pressed for 40 minutes by means of a hot press at 170°C. under a pressure of 50 kg/cm$^2$ to effect bonding. The resulting covered printed circuit sheet had its copper foil wiring complately embedded with the cover-lay of a fibrous sheet material impregnated with the resin composition of this invention, and the exposed portion of the circular land was not smudged with the resin, indicating satisfactory covering. It has also a distinguished heat resistance, and the cover-lay is sufficiently resistant to chemicals such as a flux used in soldering and not detached when subjected to flow-soldering at 260°C.

EXAMPLE 14

Two sheets of flexible printed circuit were prepared by the etching method by using a copper-clad laminate with copper foil on one surface and a copper-clad laminate with copper foil on both surfaces, both being glass cloth base and obtained in the same manner as in Example 1. On the other hand, a piece of glass cloth, 50 μ in thickness and treated with γ-glycidoxypropyltriethoxysilane, was impregnated with the resin composition, and dried. The resulting prepreg was used as an interlayer bonding sheet between the prepared single-sided circuit board and the prepared double-sided circuit board, and as coverlays of both surfaces of bonded product. Bonding was carried out by heating and pressing by means of a hot press for 60 minutes at 160°C. under a pressure of 40 kg/cm$^2$ to obtain a flexible printed circuit board with three printed circuit layers. In this board, interlayer bonding was perfectly secured by the fibrous sheet material impregnated with the present resin composition and the circuits were perfectly embedded. The adhesive layer was sufficiently resistant to chemicals such as plating chemicals used in preparing the printed circuits. The board did not suffer from the troubles such as blistering and delamination when a solder was applied with a soldering iron heated at a top-end temperature of 280°C. in loading parts on the circuits.

Table 1

| Item of test (unit) | Testing method | Treatment and condition | Sheet material thickness (μ) × No. of ply | Sample No. Example 1 Glass cloth 100 × 1 | Example 2 Glass paper 50 × 1 |
|---|---|---|---|---|---|
| Volume resistivity (Ω-cm) | JIS C 6481 | A | | 5 × 10$^{15}$ | 4 × 10$^{15}$ |
| | | C-96/40/90 | | 3 × 10$^{14}$ | 1 × 10$^{14}$ |
| Peel strength (kg-cm) | JIS C 6481 | A (direction, 180°) | | 2.2 | 2.0 |
| Chemical resistance | JIS C 6481 | Immersed in trichloroethylene, acetone, and methanol for 15 min. at room temperature | | No change | No change |

Table 1-continued

| Item of test (unit) | Testing method | Treatment and condition | Sheet material thickness ($\mu$) × No. of ply | Example 1 Glass cloth 100 × 1 | Example 2 Glass paper 50 × 1 |
|---|---|---|---|---|---|
| Folding endurance of base sheet (No. of foldings) | JIS P 8115 | *1 | | 1,200 | 1,550 |
| Soldering heat-resistance (°C.) | JIS C 6481 | Floated on solder bath for 30 seconds | | 280 | 280 |
| Gel time of varnish (sec.) | — | On hot plate at 150°C. | | 10 | 12 |

| Example 3 | Example 4 | Example 5 | Example 6 | Example 7 |
|---|---|---|---|---|
| Linter paper 100 × 1 | Polyamide paper 250 × 1 | Glassmat 50 × 3 | Polyester nonwoven fabric 200 × 1 | Glass cloth 100 × 3 |
| $7 \times 10^{14}$ | $3 \times 10^{14}$ | $2 \times 10^{15}$ | $4 \times 10^{14}$ | $2 \times 10^{14}$ |
| $3 \times 10^{13}$ | $1 \times 10^{13}$ | $5 \times 10^{14}$ | $7 \times 10^{13}$ | $8 \times 10^{13}$ |
| 2.5 | 2.3 | 2.7 | 1.9 | 3.0 |
| No change | No change | No change | No change | No change |
| 600 | 190 | 170 | 840 | 120 |
| 260 | 260 | 280 | 260 | 280 |
| 20 | 48 | 27 | 15 | 33 |

*1 Test specimen of the size 15 mm × 110 mm is repeatedly folded under a tension of 100 g load, back and forth over an edge, the radius of curvature of the profile thereof being 0.8 mm, until rupture of the specimen occurs and the number of times of folding required is counted.

Table 2

| Item of test (unit) | Testing method | Treatment and condition | Sheet material Thickness ($\mu$) × No. of ply | Example 8 Glass cloth 50 × 1 | Example 9 Polyamide paper 80 × 2 |
|---|---|---|---|---|---|
| Volume resistivity ($\Omega$-cm) | JIS C 6481 | A | | $6 \times 10^{14}$ | $1 \times 10^{14}$ |
| | | C-96/40/90 | | $4 \times 10^{13}$ | $2 \times 10^{13}$ |
| Peel strength (kg-cm) | JIS C 6481 | A (direction, 180°) | | 1.7 | 1.6 |
| Chemical resistance | JIS C 6481 | Immersed in trichloroethylene, acetone, and methanol for 15 min. at room temperature | | No change | No change |
| Folding endurance of base sheet (No. of foldings) | JIS P 8115 | *1 | | 1,650 | 140 |
| Soldering heat-resistance (°C.) | JIS C 6481 | Floated on solder bath for 30 sec. | | 270 | 260 |
| Gel time of varnish (sec.) | — | On hot plate at 150°C. | | 17 | 35 |

| Example 10 | Example 11 | Example 12 | Comparative Example 1 | Comparative Example 10 |
|---|---|---|---|---|
| Glass paper 30 × 1 | Glass cloth 100 × 1 | Glass cloth 100 × 1 | Glass cloth 100 × 1 | Glass cloth 100 × 1 |
| $1 \times 10^{14}$ | $9 \times 10^{14}$ | $2 \times 10^{15}$ | $1 \times 10^{15}$ | $8 \times 10^{14}$ |
| $5 \times 10^{13}$ | $1 \times 10^{14}$ | $6 \times 10^{14}$ | $3 \times 10^{14}$ | $5 \times 10^{13}$ |
| 1.8 | 2.0 | 1.8 | 2.0 | 1.9 |
| No change | No change | No change | No change | No change |
| 1,830 | 550 | 590 | 12 | 65 |
| 280 | 280 | 280 | 270 | 260 |
| 30 | 47 | 75 | 800 | 180 |

*1 The same as in Table 1.

Table 3

| Sample No. | Gel time of varnish, 150°C. (sec.) | Folding endurance of base sheet JIS P 8115 (No. of foldings) |
|---|---|---|
| Example 1 | 10 | 1,200 |
| Example 2 | 12 | 1,550 |
| Example 3 | 20 | 600 |
| Example 4 | 48 | 190 |
| Example 5 | 57 | 170 |

Table 3-continued

| Property<br>Sample No. | Gel time of varnish, 150°C. (sec.) | Folding endurance of base sheet JIS P 8115 (No. of foldings) |
|---|---|---|
| Example 6 | 15 | 840 |
| Comparative Example 1 | 800 | 12 |
| Comparative Example 2 | 800 | 15 |
| Comparative Example 3 | 800 | 7 |
| Comparative Example 4 | 800 | 3 |
| Comparative Example 5 | 800 | 1 |
| Comparative Example 6 | 800 | 10 |

Table 4

| Recipe and property | No. | Comparative Example 7 | Comparative Example 8 | Comparative Example 9 |
|---|---|---|---|---|
| Polyepoxy compound (part by weight) | | Epikote No. 1001 100 | Epikote No. 1001 100 | Epikote No. 1001 100 |
| Curing agent (part by weight) | | Menthane-diamine 25 | Menthane-diamine 15 | Menthane-diamine 15 |
| Flexibility-imparting agent (part by weight) | | Hexanediol diglycidyl ether 40 | Acrylonitrile-butadiene copolymer* 45 | Polyester resin** 50 Tolylene diisocyanate 5 Insolubles deposited |
| Gel time of varnish 150°C. (sec.) | | 480 | 600 | |
| Volume resistivity ($\Omega$-cm) | A<br>C | $8 \times 10^{14}$<br>$4 \times 10^{13}$ | $2 \times 10^{14}$<br>$7 \times 10^{13}$ | —<br>— |
| Peel strength (kg-cm) | | 2.1 | 2.3 | — |
| Chemical resistance (trichloroethylene, acetone) | | Base sheet swollen | Base sheet cloudy | — |
| Folding endurance (No. of foldings) | | 80 | 76 | — |
| Soldering heat-resistance (°C.) | | 230 | 240 | — |

Testing method is the same as in Table 1.
*The same as used in Example 4.
**The same as used in Example 6.

Table 5

| Property<br>Sample No. | Gel time of varnish, 150°C. (sec.) | Folding endurance of base sheet, JIS P 8115 (No. of foldings) |
|---|---|---|
| Example 1 | 10 | 1,200 |
| Example 11 | 47 | 550 |
| Example 12 | 63 | 590 |
| Comparative Example 1 | 800 | 12 |
| Comparative Example 10 | 180 | 65 |
| Comparative Example 11 | 210 | 260 |
| Comparative Example 12 | 300 | 370 |

What is claimed is:

1. A method for manufacturing a metalclad laminate for flexible printed circuits, which comprises impregnating an electrically insulating fibrous base material with a resin composition comprising a mixture of 100 parts by weight of at least one polyepoxy compound having at least two epoxy groups in the molecule and 10 to 300 parts by weight of at least one copolymer selected from the group consisting of copolymers (A) of aromatic vinyl compounds with maleic anhydride, said copolymers containing at least 30 mole percent of maleic anhydride structural units in the molecule, alkyl partial esters (B) of said copolymers (A), copolymers (C) of aromatic vinyl compounds with alkyl maleates, said copolymers containing at least 30 mole percent of mono-alkyl maleate structural units in the molecule, and copolymers (D) of aromatic vinyl compounds with maleic anhydride and alkyl maleates, said copolymers containing at least 30 mole percent, in total, of maleic anhydride structural units and monoalkyl maleate structural units in the molecule and having a number average molecular weight of from 2,000 to 30,000, then placing the resulting impregnated base material and a metal foil one over the other, and bonding together by application of heat and pressure.

2. A method for manufacturing a metal-clad laminate for flexible printed circuits according to claim 1, wherein at least 20% by weight of the polyepoxy compound are such a flexible polyepoxy compound that a base sheet obtained by mixing 100 parts by weight of said polyepoxy compound and 100 parts by weight of a copolymer of styrene with maleic anhydride, said copolymer containing 50 mole percent of maleic anhydride structural units, impregnating a glass cloth, 0.1 mm in thickness, with the resulting mixture, and curing completely by application of heat and pressure by means of a hot press, can show a folding endurance number of 100 or more as measured in compliance with the standard testing method specified in JIS P 8115.

3. A method for manufacturing a metal-clad laminate for flexible printed circuits according to claim 1, wherein at least 20% by weight of the polyepoxy compound are a polyether-type epoxy compound represented by the general formula

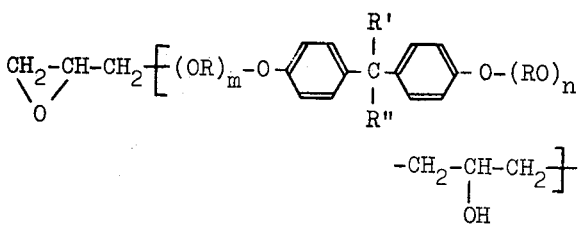

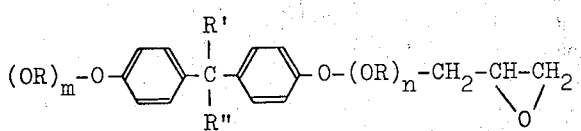

wherein R is an alkylene group having 2 to 4 carbon atoms, R' and R" are hydrogen atoms or alkyl groups having 1 to 5 carbon atoms, and m and n are integers of 1 to 3.

4. A method for manufacturing a metal-clad laminate for flexible printed circuits, which comprises impregnating an electrically insulating fibrous base material with a resin composition obtained by incorporating in the resin composition defined in claim 1, with at least one additional member selected from the group consisting of reactive epoxy diluents containing at least one epoxy group in the molecule, acrylonitrile-butadiene copolymers containing 25 to 50% by weight of acrylonitrile units, and mixtures of saturated linear polyester resins obtained by polycondensation of dibasic acids with dihydric alcohols and polyisocyanate compounds containing at least two isocyanate groups in the molecule, in a proportion of 5 to 70 parts by weight of each additional member (provided that the sum of two or more additional members does not exceed 150 parts by weight) to 100 parts by weight of the polyepoxy compound, the placing the impregnated base material and a metal foil one over the other, and bonding together by application of heat and pressure.

5. A method for maufacturing a metal-clad laminate for flexible printed circuits, which comprises impregnating an electrically insulating fibrous base material with a resin composition obtained by incorporating in the resin composition defined in claim 2, with at least one additional member selected from the group consisting of reactive epoxy diluents containing at least one epoxy group in the molecule, acrylonitrilebutadiene copolymers containing 25 to 50% by weight of acrylonitrile units, and mixtures of saturated linear polyester resins obtained by polycondensation of dibasic acids with dihydric alcohols and polyisocyanate comcompounds containing at least two isocyanate groups in the molecule, in a proportion of 5 to 70 parts by weight of each additional member (provided that the sum of two or more additional members does not exceeds 150 parts by weight) to 100 parts by weight of the polyepoxy compound, then placing the impregnated base material and a metal foil one over the other, and bonding together by application of heat and pressure.

6. A method for manufacturing a metal-clad laminate for flexible printed circuits, which comprises impregnating an electrically insulating fibrous base material with a resin composition obtained by incorporating in the resin composition defined in claim 3 with at least one additional member selected from the group consisting of reactive epoxy diluents containing at least one epoxy group in the molecule, acrylonitrilebutadiene copolymers containing 25 to 50% by weight of acrylonitrile units, and mixtures of saturated linear polyester resins obtained by polycondensation of dibasic acids with dihydric alcohols and polyisocyanate compounds containing at least two isocyanate groups in the molecule, in a proportion of 5 to 70 parts by weight of each additional member (provided that the sum of two or more additional members does not exceed 150 parts by weight) to 100 parts by weight of the polyepoxy compound, then placing the impregnated base material and a metal foil one over the other, and bonding together by application of heat and pressure.

7. A method according to claim 1, for manufacturing a metal-clad laminate for flexible printed circuits, wherein the resin composition contains 30 to 100 parts by weight of a copolymer of a styrene compound with maleic anhydride, said copolymer containing at least 30 mole percent of maleic anhydride structural units.

8. A method according to claim 2, for manufacturing a metal-clad laminate for flexible printed circuits, wherein the resin composition contains 30 to 100 parts by weight of a copolymer of a styrene compound with maleic anhydride, said copolymer containing at least 30 mole percent of maleic anhydride structural units.

9. A method according to claim 3 for manufacturing a metal-clad laminate for flexible printed circuits, wherein the resin composition contains 30 to 100 parts by weight of a copolymer of a styrene compound with maleic anhydride, said copolymer containing at least 30 mole percent of maleic anhydride structural units.

10. A method according to claim 4 for manufacturing a metal-clad laminate for flexible printed circuits, wherein the resin composition contains 30 to 100 parts by weight of a copolymer of a styrene compound with maleic anhydride, said copolymer containing at least 30 mole percent of maleic anhydride structural units.

11. A method for manufacturing a metal-clad laminate for flexible printed circuits, which comprises impregnating an electrically insulating fibrous base material with the resin composition defined in claim 1, and bonding the impregnated base material to a metal foil by application of heat and pressure by means of the press rolls consisting of a metal roll and a rubber roll of a roll-laminator by passing said impregnated base material together with said metal foil through between the press rolls in such a manner that the impregnated base material contacts with the metal roll through a releasing material interposed between the base material and the metal roll, and the metal foil comes in contact with the rubber roll and is allowed to wrap the rubber roll from the position on the circumference of the rubber roll for $\pi/4$ or more radians toward the contact line of both rolls.

12. A method for manufacturing a metal-clad laminate for flexible printed circuits, which comprises impregnating an electrically insulating fibrous base material with the resin composition defined in claim 7, and bonding the impregnated base material to a metal foil by application of heat and pressure by means of the press rolls consisting of a metal foil and a rubber roll of a roll-laminator by passing said impregnated base material together with said metal foil through between the press rolls in such a manner that the impregnated base material contacts with the metal roll through a releasing material interposed between the base material and the metal roll, and the metal foil comes in contact with the rubber roll and is allowed to wrap the rubber roll from the position on the circumference of the rubber roll for $\pi/4$ or more radians toward the contact line of both rolls.

13. A method for manufacturing a metal-clad laminate for flexible printed circuits, which comprises impregnating an electrically insulating fibrous base material with the resin composition defined in claim 8, and bonding the impregnated base material to a metal foil by application of heat and pressure by means of the press rolls consisting of a metal roll and a rubber roll of a roll-laminator by passing said impregnated base material together with said metal foil through between the press rolls in such a manner that the impregnated base material contacts with the metal roll through a releasing material interposed between the base material and the metal roll, and the metal foil comes in contact with the rubber roll and is allowed to wrap the rubber roll from the position on the circumference of the rubber roll for $\pi/4$ or more radians toward the contact line of both rolls.

14. A method for manufacturing a metal-clad laminate for flexible printed circuits, which comprises impregnating an electrically insulating fibrous base material with the resin composition defined in claim 9, and bonding the impregnated base material to a metal foil by application of heat and pressure by means of the press rolls consisting of a metal roll and a rubber roll of a roll-laminator by passing said impregnated base material together with said metal foil through between the press rolls in such a manner that the impregnated base material contacts with the metal roll through a releasing material interposed between the base material and the metal roll, and the metal foil comes in contact with the rubber roll and is allowed to wrap the rubber roll from the position on the circumference of the rubber roll for $\pi/4$ or more radians toward the contact line of both rolls.

15. A method for manufacturing a metal-clad laminate for flexible printed circuits, which comprises impregnating an electrically insulating fibrous base material with the resin composition defined in claim 10, and bonding the impregnated base material to a metal foil by application of heat and pressure by means of the press rolls consisting of a metal roll and a rubber roll of a roll-laminator by passing said impregnated base material together with said metal foil through between the press rolls in such a manner that the impregnated base material contacts with the metal roll through a releasing material interposed between the base material and the metal roll, and the metal foil comes in contact with the rubber roll and is allowed to wrap the rubber roll from the position on the circumference of the rubber roll for $\pi/4$ or more radians toward the contact line of both rolls.

16. A method according to claim 4, wherein the electrically insulating fibrous base material is a glass cloth.

17. A method according to claim 4, wherein the electrically insulating fibrous base material is a glass paper.

18. A method according to claim 4, wherein the electrically insulating fibrous base material is a polyamide paper.

19. A method according to claim 4, wherein the electrically insulating fibrous base material is a polyester non-woven fabric.

20. A method according to claim 4, wherein the electrically insulating fibrous base material is a glass cloth and the metal foil is a copper foil.

21. A metal-clad laminate for flexible printed circuits obtained by the method according to claim 1.

22. A metal-clad laminate for flexible printed circuits obtained by the method according to claim 4.

23. A metal-clad laminate for flexible printed circuits obtained by the method according to claim 11.

24. A metal-clad laminate for flexible printed circuits obtained by the method according to claim 16.

25. A metal-clad laminate for flexible printed circuits obtained by the method according to claim 17.

26. A metal-clad laminate for flexible printed circuits obtained by the method according to claim 18.

27. A metal-clad laminate for flexible printed circuits obtained by the method according to claim 19.

28. A metal-clad laminate for flexible printed circuits obtained by the method according to claim 20.

* * * * *